(12) United States Patent
Ge et al.

(10) Patent No.: US 7,852,252 B2
(45) Date of Patent: Dec. 14, 2010

(54) SINGLE-ENDED TO DIFFERENTIAL AMPLIFICATION AND PIPELINE ANALOG-TO-DIGITAL CONVERSION FOR DIGITALLY CONTROLLED DC-DC CONVERTERS

(75) Inventors: Fuding Ge, Chandler, AZ (US); Brent D. Thomas, Chandler, AZ (US); Malay Trivedi, Chandler, AZ (US); James T. Doyle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 12/347,081

(22) Filed: Dec. 31, 2008

(65) Prior Publication Data

US 2010/0164622 A1  Jul. 1, 2010

(51) Int. Cl.
*H03M 1/12* (2006.01)
(52) U.S. Cl. ...................... 341/155; 341/172
(58) Field of Classification Search ................. 341/144, 341/161, 155, 118, 120, 172
See application file for complete search history.

(56) References Cited

U.S. PATENT DOCUMENTS

| | | | | |
|---|---|---|---|---|
| 4,086,541 A | * | 4/1978 | Katou et al. | 330/51 |
| 4,742,292 A | * | 5/1988 | Hoffman | 323/314 |
| 5,461,381 A | * | 10/1995 | Seaberg | 341/143 |
| 5,838,200 A | * | 11/1998 | Opris | 330/258 |
| 5,847,600 A | * | 12/1998 | Brooks et al. | 330/9 |
| 6,707,405 B2 | * | 3/2004 | Kuttner | 341/141 |
| 7,208,983 B2 | * | 4/2007 | Imaizumi et al. | 327/94 |
| 7,679,422 B1 | * | 3/2010 | Thiagarajan et al. | 327/337 |
| 7,692,489 B2 | * | 4/2010 | Kelly et al. | 330/258 |

OTHER PUBLICATIONS

"Digital Power Controller", Si8250/1/2, Silicon Laboratories, Preliminary Rev. 0.5 8/05, Copyright 2005, Silicon Technology, pp. 1-288.
"UCD9240 Digital Point of Load System Controller", UCD9240, SLUS766, Texas Instruments Incorporated, Apr. 2007, pp. 1-21.
"Digital Multi-Phase PWM Controller for Core-Voltage Regulation", ISL6590, intersil, Apr. 2003, pp. 1-25.
Peterchev, A. V., et al., "Architecture and IC Implementation of a Digital VRM Controller", IEEE Transactions on Power Electronics, vol. 18, No. 1, Jan. 2003, pp. 356-364.
Parayandeh, A. "Programmable Analog-to-Digital Converter for Low-Power DC-DC SMPS", IEEE Transactions on Power Electronics, vol. 23, No. 1, Jan. 2008, pp. 500-505.

* cited by examiner

*Primary Examiner*—Peguy JeanPierre
(74) *Attorney, Agent, or Firm*—Garrett IP, LLC (57) ABSTRACT

Methods and systems to amplify and convert a single-ended analog signal to a differential signal and to convert the differential signal to a digital value, including to time-multiplex a plurality of windowed single-ended analog error signals, amplify a difference between the time-multiplexed analog signals, sample a corresponding amplified difference signal and an inverted amplified difference signal, amplify and center the samples about a common mode, and convert a corresponding amplified differential signal to digital values in a pipeline fashion. Bias adjustable features may be implemented to control a bandwidth, and clock rates may be adjustable to correspond to the bandwidth.

20 Claims, 7 Drawing Sheets

SINGLE-ENDED TO DIFFERENTIAL AMPLIFICATION AND PIPELINE ANALOG-TO-DIGITAL CONVERSION FOR DIGITALLY CONTROLLED DC-DC CONVERTERS

BACKGROUND

A digitally controlled DC-DC converter may include an analog-to-digital converter (ADC) to convert a difference between a reference DC level and an output DC level to a digital value. The difference may be windowed and amplified prior to digital conversion. The digital value may be provided to a digital controller or compensator, such as a proportional, integral, derivative (PID) controller, to control the DC-DC converter to reduce the difference.

Digital converters for digitally controlled DC-DC converter include flash-type ADCs, delay-locked loops, and voltage controlled oscillators.

Where multiple DC levels are generated, multiple corresponding amplification and digital conversion circuits may be implemented, but at a cost of additional space and power consumption.

BRIEF DESCRIPTION OF THE DRAWINGS/FIGURES

In the drawings, the leftmost digit(s) of a reference number identifies the drawing in which the reference number first appears.

DETAILED DESCRIPTION

Figure 1:
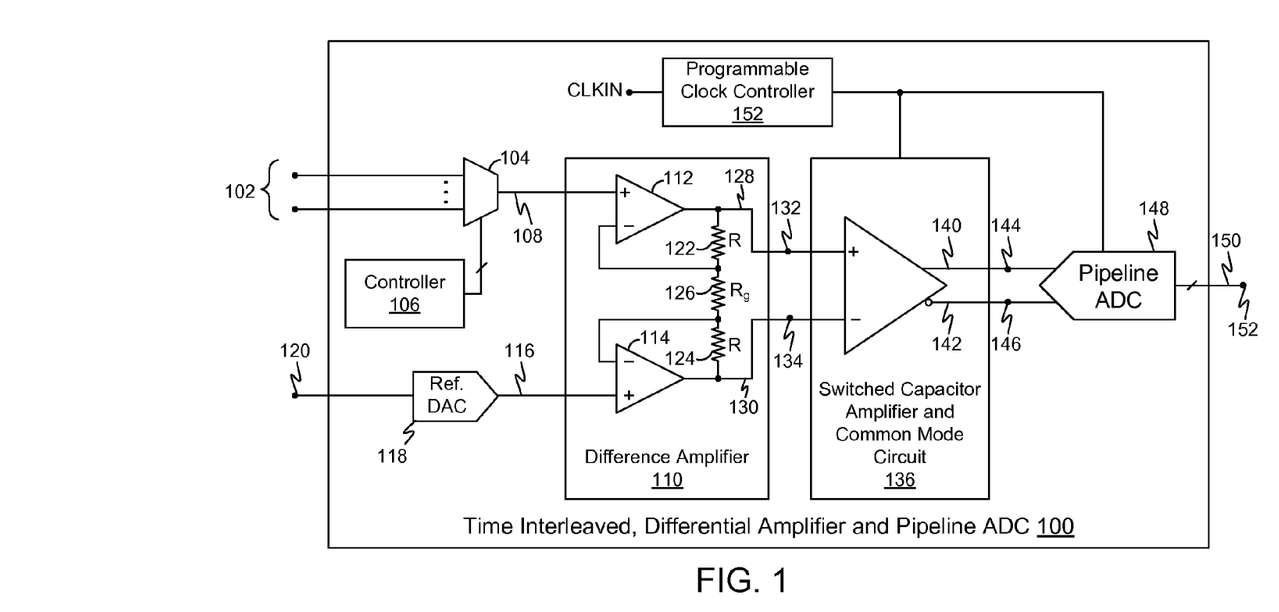
FIG. 1 is a block diagram of an exemplary time-interleaved, single-ended to differential amplifier and pipeline analog-to-digital converter system.

FIG. 1 is a block diagram of an exemplary time-interleaved, single-ended to differential amplifier and pipeline analog-to-digital converter (ADC) system 100, to receive and time-interleave a plurality of analog signals 102, and to output digital values 150 corresponding to voltage levels of analog signals 102.

System 100 includes a multiplexer 104 to receive analog signals 102, and a controller 106 to control multiplexer 104 to time-multiplex or time-interleave analog signals 102 as time-multiplexed analog signals 108. Multiplexer 104 and/or controller 106 may include break-before-make switch circuitry.

System 100 includes a difference amplifier 110 to amplify a difference between a reference voltage 116 and time-multiplexed analog signals 108. Difference amplifier 110 may be configured to output an amplified difference signal 128 at a first or non-inverted output node 132, and to output an inverted amplified difference signal 130 at a second or inverted output node 134.

System 100 may include a reference voltage generator, illustrated in FIG. 1 as a reference digital-to-analog converter (DAC) 118, to generate reference voltage 116. Reference DAC 118 may include an input to receive a digital control signal 120, and may be controlled to implement a soft-start, such as to accommodate a band gap voltage reference associated with one or more components of system 100.

Difference amplifier 110 may be configured as a relatively high-impedance difference amplifier, and may include first and second operational amplifiers 112 and 114, respectively, and a plurality of resistors, illustrated here as resistors 122 and 124, having a resistance R, and a resistor 126 having a resistance $R_{Gain}$. A gain of difference amplifier 110 may be defined in accordance with $(1+2R/R_{Gain})$. Difference amplifier 110 may be configured for a gain of, for example and without limitation, approximately 4.

Difference amplifier 110 may be configured as an input buffer of an instrumentation amplifier.

Figure 2:
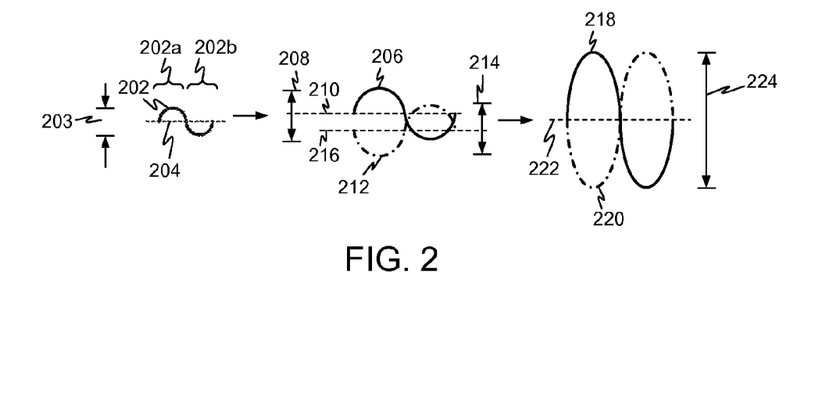
FIG. 2 is a graphical representation of exemplary amplitude values corresponding to the system of FIG. 1.

FIG. 2 is a graphical representation of exemplary amplitude values corresponding to system 100. A first signal 202 represents an exemplary amplitude range 203 of analog signals 102, relative to a reference level 204, which may correspond to reference signal 116 in FIG. 1. In the example of FIG. 2, first signal 202 may include a range of amplitude values 202a that are greater than reference level 204 and a range of amplitude values 202b that are less than reference level 204. Amplitude range 203 may be, for example and without limitation, approximately 120 millivolts (mV), and reference level 204 may be, for example and without limitation, approximately 1.2 volts.

A second signal 206 represents an exemplary corresponding amplitude range 208 of amplified difference signal 128, centered about a reference level 210. A third signal 212 represents an exemplary corresponding amplitude range 214 of inverted amplified difference signal 130, centered about a reference level 216. Amplitude ranges 208 and 214 may be substantially similar to one another, and reference levels 208 and 212 may differ from one another. Second and third signals 206 and 212 may be referred to as a pseudo-differential signal pair.

Referring back to FIG. 1, system 100 includes a switched-capacitor amplifier and common mode circuit (SC Amp) 136, to amplify a difference between signals 128 and 130, to align the difference about a common mode conditioning voltage level, and to output a resultant differential pair of signals 140 and 142 at respective outputs 144 and 146. SC Amp 136 may be configured to amplify by a gain factor of, for example and without limitation, approximately 2.5.

In FIG. 2, a signal 218 represents an exemplary amplitude range 224 of differential signal 140, centered about a common mode voltage 222. A signal 220 represents amplitude range 224 of inverted differential signal 142, centered about common mode voltage 222. Amplitude range 224 may be in a range of, for example and without limitation, approximately 1.2 volts, and common mode voltage 222 may be, for example and without limitation, approximately 0.75 volts.

Differential signals 140 and 142 may have a stepped appearance as a result of sample and hold operations within SC Amp 136.

Difference amplifier 110 and SW Amp 136 may be configured as an instrumentation amplifier.

Referring back to FIG. 1, system 100 includes a differential input, pipeline analog-to-digital converter (ADC) 148 to convert differential signals 140 and 142 to digital values 150 at an output 152.

Figure 3:
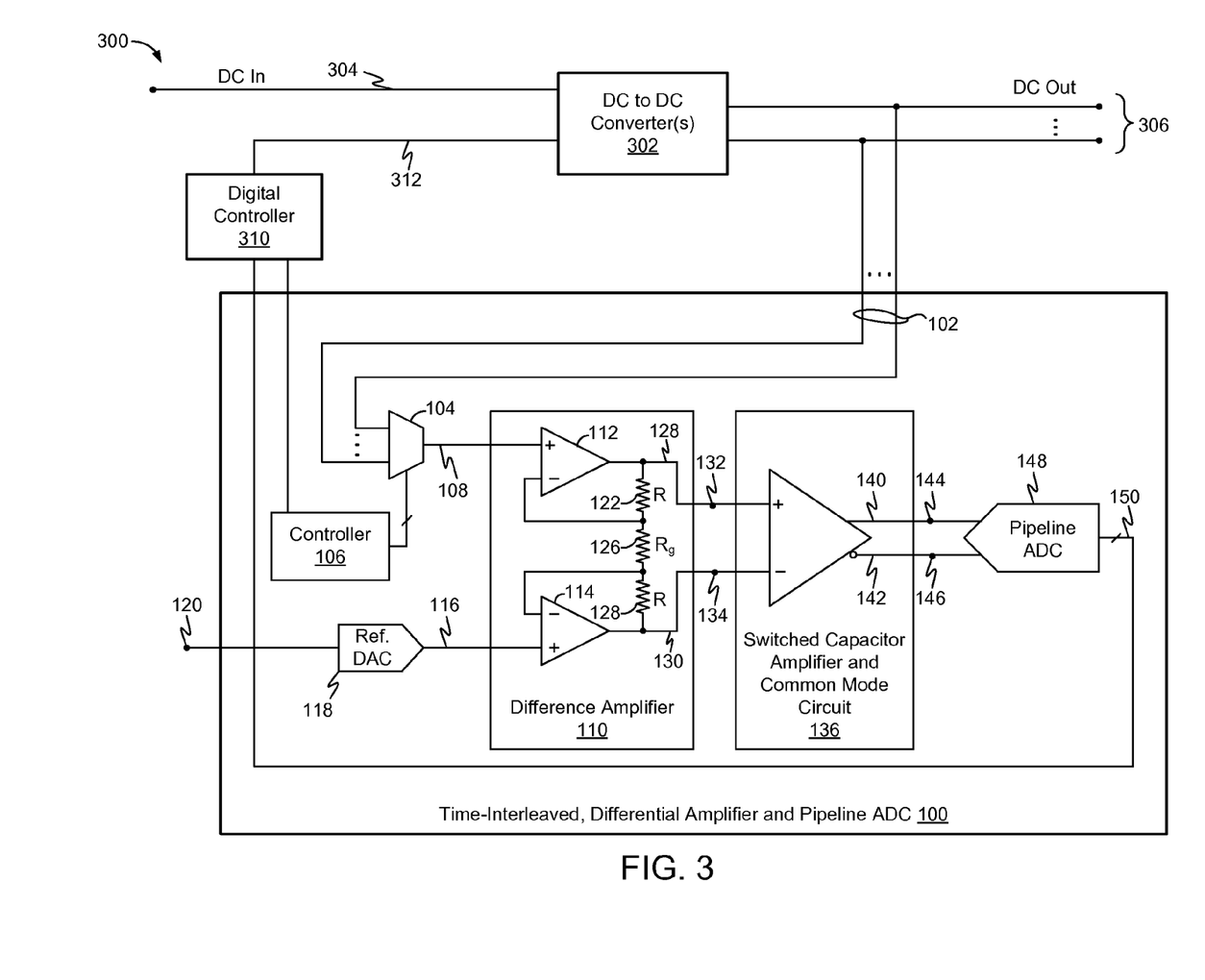
FIG. 3 is a block diagram of an exemplary digitally controlled DC-to-DC converter system.

System 100 may be implemented as part of a digitally controlled DC-to-DC voltage converter. FIG. 3 is a block diagram of an exemplary digitally controlled DC-to-DC voltage converter system 300, including a DC-to-DC voltage converter 302 to receive one or more input DC levels 304 and to output a plurality of DC levels 306. DC output levels 306 may be provided to system 100 as analog signals 102, and system 300 may include a digital controller 310 to receive corresponding digital values 150 from system 100 and to adjust one or more outputs 312 to DC-to-DC converter 302 in response to digital values 150.

Controller 106 may be configured to synchronize operation of digital controller 310 and multiplexer 104.

Figure 4:
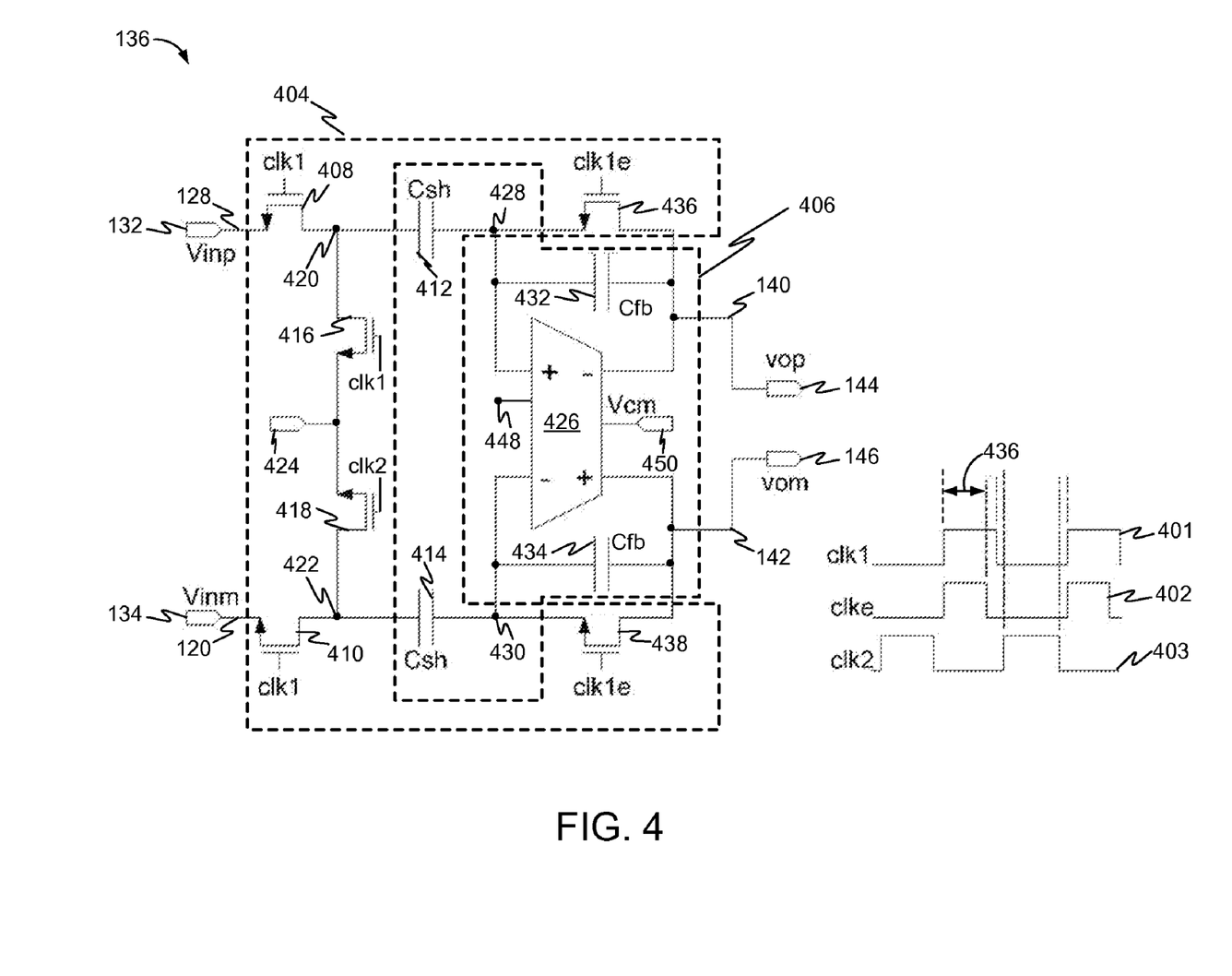
FIG. 4 is an exemplary circuit diagram of a switched capacitor amplifier and common mode circuit, and a graphical depiction of exemplary corresponding control or clock signals.

FIG. 4 is an exemplary circuit diagram of SC Amp 136, including a graphical depiction of exemplary corresponding control or clock signals 401, 402, and 403.

In the example of FIG. 4, SC Amp 136 includes a multiple input switched capacitor sample circuit (SC sample circuit) 404 to sample amplified difference signal 128 and inverted amplified difference signal 130, and a differential amplifier 406 to amplify the samples and to output differential signals 140 and 142 at corresponding nodes 144 and 146.

SC sample circuit 404 includes first and second sample switch devices 408 and 410, and corresponding sample capacitors Csh 412 and Csh 414 to periodically sample or transfer charge from amplified difference signals 128 and 130 to sample capacitors Csh 412 and Csh 414, under control of clock signal 401.

SC sample circuit 404 may include first and second pass devices 436 and 438, respectively, to provide charge paths for corresponding sample capacitors Csh 412 and Csh 414 during a portion 436 of each sample phase, under control of clock signal 404, and to terminate the charge paths thereafter. This may reduce an impact of charge injection associated with switching action at switch devices 408 and 410.

SC sample circuit 404 may include first and second reset switches 416 and 418 to reset or center corresponding capacitors Csh 412 and 414 to a common mode or reference at node 424, between sample cycles under control of clock signal 403. In the example of FIG. 4, clock signals 401 and 403 are substantially out of phase with respect to one another, with non-overlapping clock edges.

Differential amplifier 406 includes capacitors Csh 412 and Csh 414 and a bias adjustable differential amplifier 426 to amplify samples or charge from capacitors Csh 412 and Csh 414. In the example of FIG. 4, SC Amp 136 is configured with a flip-around structure to utilize capacitors Csh 412 and Csh 414 to sample and amplify. Differential amplifier 406 may include an operational transconductance amplifier (OTA).

Differential amplifier 406 may include first and second feedback capacitors Cfb 432 and Cfb 434 coupled between nodes 144 and 428, and nodes 146 and 430, respectively.

Amplifier 426 may include a bias input 448 to control one or more features of amplifier 426. For example, and without limitation, a current may be adjustable to control a bandwidth of amplifier 426, which may adjust a processing speed of amplifier 426. The bandwidth may be adjusted to correspond to an amplitude range at nodes 428 and 430. Example bias adjustment features are described below with respect to FIG. 5.

Amplifier 426 may include common mode circuitry to adjust a common mode level and may include common-mode-rejection circuitry to reduce common mode noise. Amplifier 426 may include a common-mode input node 450 to receive a common-mode voltage, which may correspond to a voltage at node 424.

Figure 5:
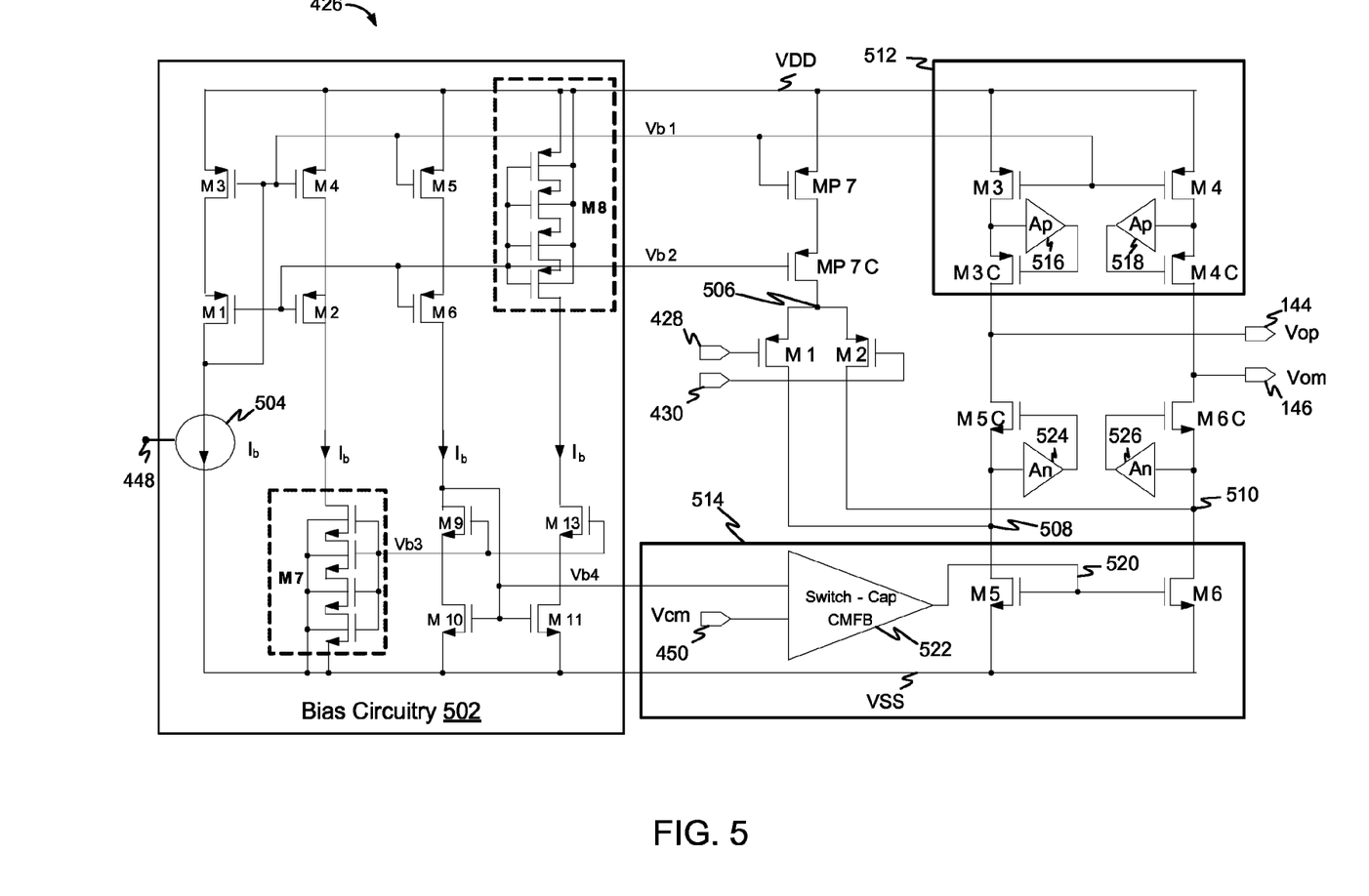
FIG. 5 is an exemplary circuit diagram of a bias adjustable differential amplifier.

FIG. 5 is an exemplary circuit diagram of amplifier 426 including bias circuitry 502 to generate a plurality of bias voltages, illustrated here as Vb1, Vb2, Vb3, and Vb4, in response to an adjustable current source 504 and bias input 448.

In the example of FIG. 5, amplifier 426 includes input devices M1 and M2, which are controlled in response to samples or charge at nodes 428 and 430. Devices M1 and M2 may be viewed as adjustable resistances between a node 506 and corresponding nodes 508 and 510, and/or may be viewed as voltage controlled voltage sources to nodes 508 and 510.

Node 506 is coupled to a supply node VDD through devices MP7 and MP7C, which are controlled by bias voltages Vb1 and Vb2, respectively. Devices MP7 and MP7C may be viewed as voltage controlled resistors between VDD and node 506, and/or as a voltage controlled voltage source to node 506.

Devices M1 and M2 provide a voltage to corresponding nodes 508 and 510 relatively proportional to samples or charge at nodes 428 and 430, respectively.

The voltages at nodes 508 and 510 inversely control output voltages at corresponding output nodes 144 and 146, within an upper limit defined by circuitry 512, and about a common mode defined by circuitry 514, as described below.

Within circuitry 512, devices M3 and M4 are controlled by bias voltage Vb1, and devices M3C and M4C are controlled by corresponding gain-boosting amplifiers 516 and 518, to provide an upper limit voltage at corresponding output nodes 144 and 146.

Figure 6:
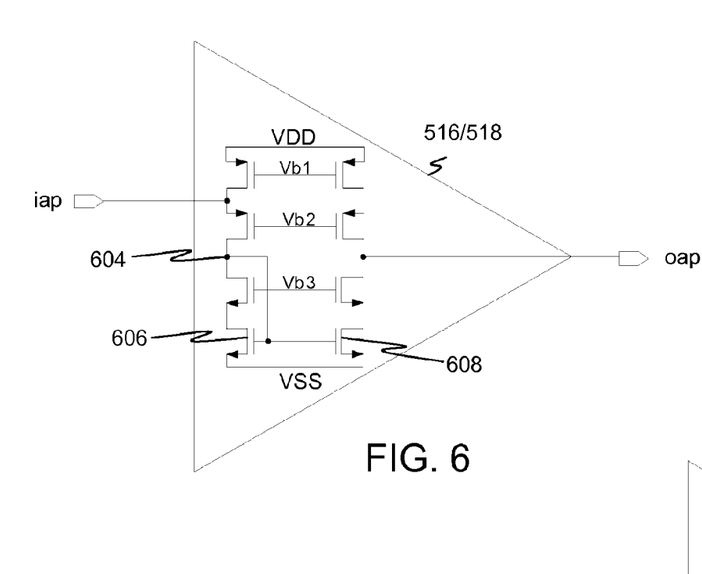
FIG. 6 is an exemplary circuit diagram of a bias controlled gain boosting amplifier.

FIG. 6 is an exemplary circuit diagram of gain-boosting amplifiers 516 and 518, biased under control of bias voltages Vb1, Vb2, and Vb3. In operation, as an input voltage iap increases, a voltage at a node 604 increases, which increasingly turns on devices 606 and 608. As device 608 increasingly turns on, an output voltage oap increases. Conversely, as input voltage iap decreases, output voltage oap decreases. Bias voltages Vb1, Vb2, and Vb3 may be adjusted to optimize a bandwidth of gain-boosting amplifiers 516 and 518, which may include adjusting to accommodate a signal swing associated with input voltage iap.

Bias voltages Vb1, Vb2, and Vb3 thus determine a proportion of voltage VDD, or an upper limit voltage, that is available at output nodes 144 and 146 (FIG. 5).

Referring back to FIG. 5, circuitry 514 includes devices M5 and M6, controlled by a common mode voltage 520 generated by a switched-capacitor common-mode-rejection feedback circuit (CMFB) 522. CMFB 522 is configured to generate common mode voltage 520 in response to common-mode voltage at node 450 and bias voltage Vb4. Devices M5 and M6 thus provide a bias controlled path to VSS. Circuitry 514 may help to center output voltages at nodes 144 and 146 about common mode and/or to reduce common mode noise.

Device M5C and gain boosting amplifier 524, and device M6C and gain boosting amplifier 526, are configured to control output voltages at corresponding output nodes 144 and 146, inversely in response to voltages at nodes 508 and 510. For example, with respect to output node 144, as the voltage at node 508 increases, device M5C increasingly turns off, causing the voltage at output node 144 to increase towards the upper limit voltage available through devices M3 and M3C. Conversely, as the voltage at node 508 decreases, device M5C increasingly turns on, causing the voltage at output node 144 to decrease towards VSS through devices M5C and M5.

Figure 7:
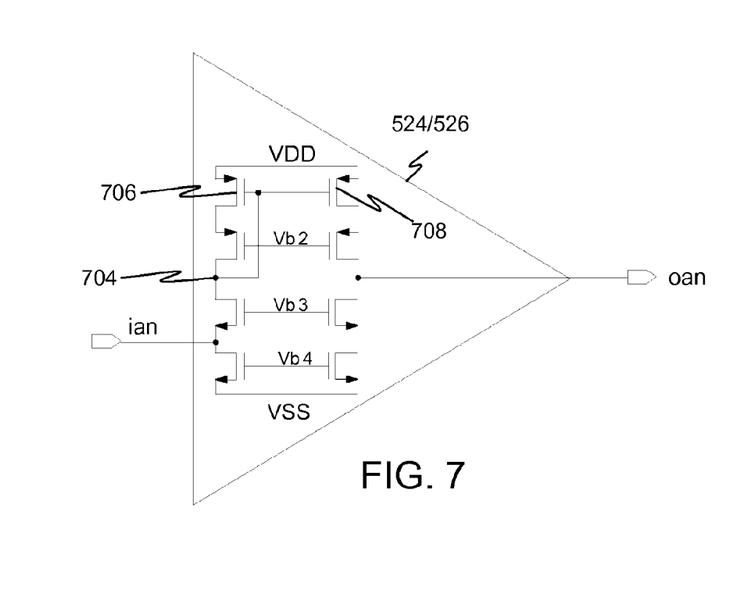
FIG. 7 is an exemplary circuit diagram of another bias controlled gain-boosting amplifier.

FIG. 7 is an exemplary circuit diagram of gain-boosting amplifiers 524 and 526, biased under control of bias voltages Vb2, Vb3, and Vb4. In operation, as an input voltage ian increases, a voltage a node 704 increases, which increasingly turns on devices 706 and 708. As device 708 increasingly turns on, an output voltage oan increases. Conversely, as input voltage ian decreases, output voltage oan decreases. Bias voltages Vb2, Vb3, and Vb4 may be adjusted to accommodate a signal swing associated with input voltage ian, to optimize a bandwidth of gain-boosting amplifiers 524 and 526.

Figure 8:
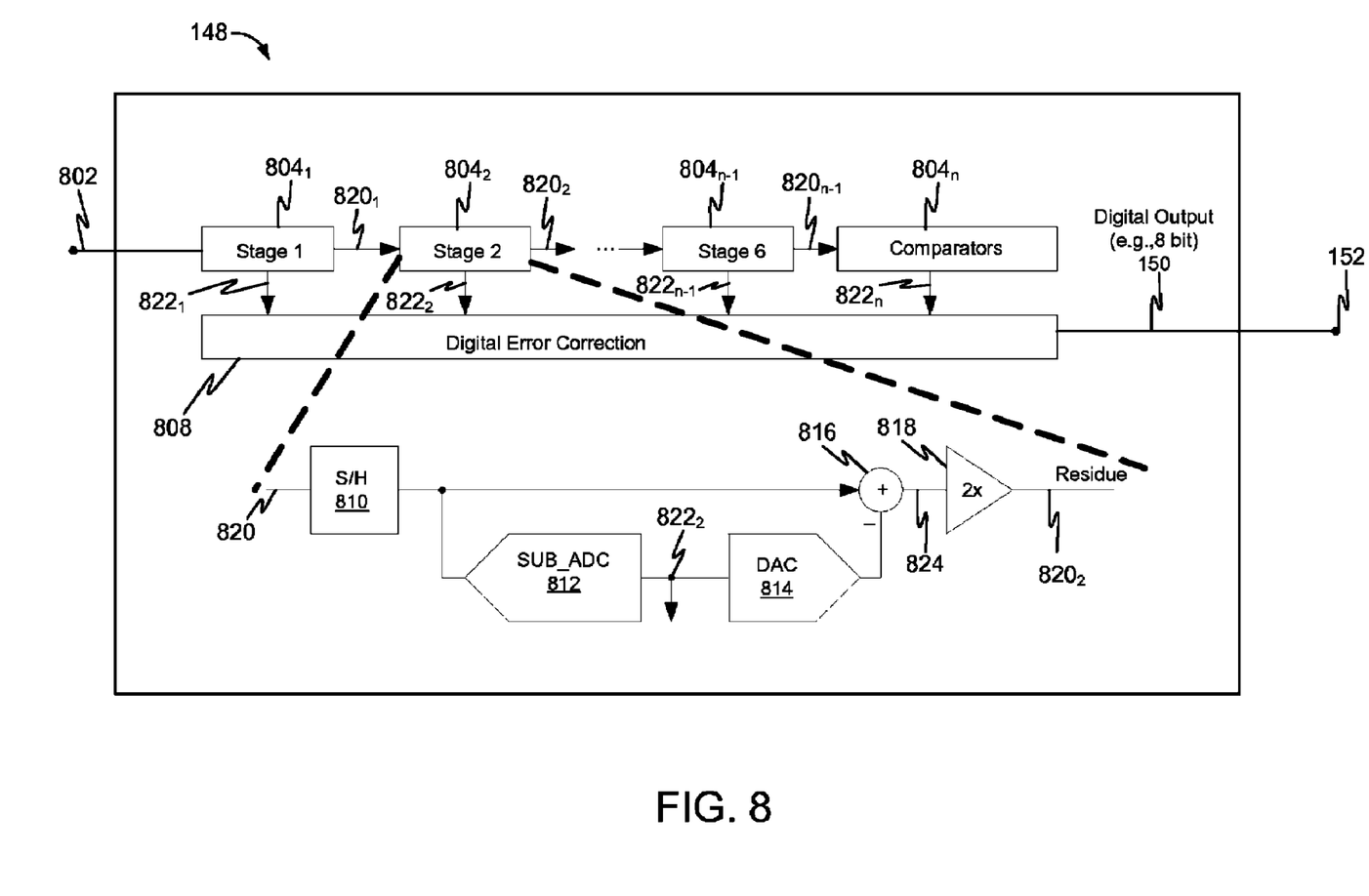
FIG. 8 is an exemplary block diagram of a pipeline analog-to-digital converter.

FIG. 8 is an exemplary block diagram of ADC 148 (FIG. 1) including a differential analog input 802 to receive differential signals 144 and 146, and a plurality of pipeline stages $804_1$ through $804_n$, each to generate a corresponding set of successively less significant bits, including most significant bits $822_1$ through least significant bits $822_n$, representative of a magnitude of a corresponding analog signal 102 (FIG. 1). Stages $804_1$ through $804_{n-1}$ may be configured similarly to one another, and stage $804_n$ may include one or more comparators as described below.

Exemplary stage $804_2$ includes a sample and hold circuit 810, a sub-ADC 812, a digital-to-analog converter (DAC) 814, an adder 816, and a gain device 818. Sample and hold circuit 810 is configured to sample and hold an input $820_1$ for a hold period. Sub-ADC 812 is configured to quantize the sample during a portion of the hold period, and may be configured to quantize the sample to two bits. Corresponding quantized bits $822_2$ are provided to DAC 814 to convert the bits to an analog value, which is subtracted from the sample at adder 816. The result of the subtraction, or residue 824, is amplified by gain device 818, illustrated here as a 2x gain device. A resultant amplified residue $820_2$ is provided to subsequent stage $802_3$, to be sampled as described above. Comparators within stage $804_n$ may be configured to resolve an amplified residue $820_{n-1}$ from stage $804_{n-1}$ to least significant bits $822_n$.

Quantized bits $822_1$ through $822_n$ may be provided to a digital error correction circuit 808 to correct errors prior to outputting digital values corresponding to an analog signal 102 (FIG. 1).

Quantized bits $822_1$ through $822_1$ are generated at successively later times and may be time-aligned, such as with shift registers, prior to digital error correction circuit 808.

ADC 140 may be configured to process a subsequent differential sample at first stage $804_1$ after stage $804_1$ outputs a residue at $820_1$ corresponding to a preceding sample, and prior to completion of processing of the prior sample in one or more stages $804_2$ through $804_n$. This may improve a processing time associated with system 100.

Referring back to FIG. 1, system 100 may include a programmable clock controller 152 to control or adjust clock rates to SC Amp 136 and ADC 148. Programmable clock controller 152 may be configured to control or adjust the clock rates to correspond to a bandwidth changes to SC Amp 136, as described above.

Figure 9:
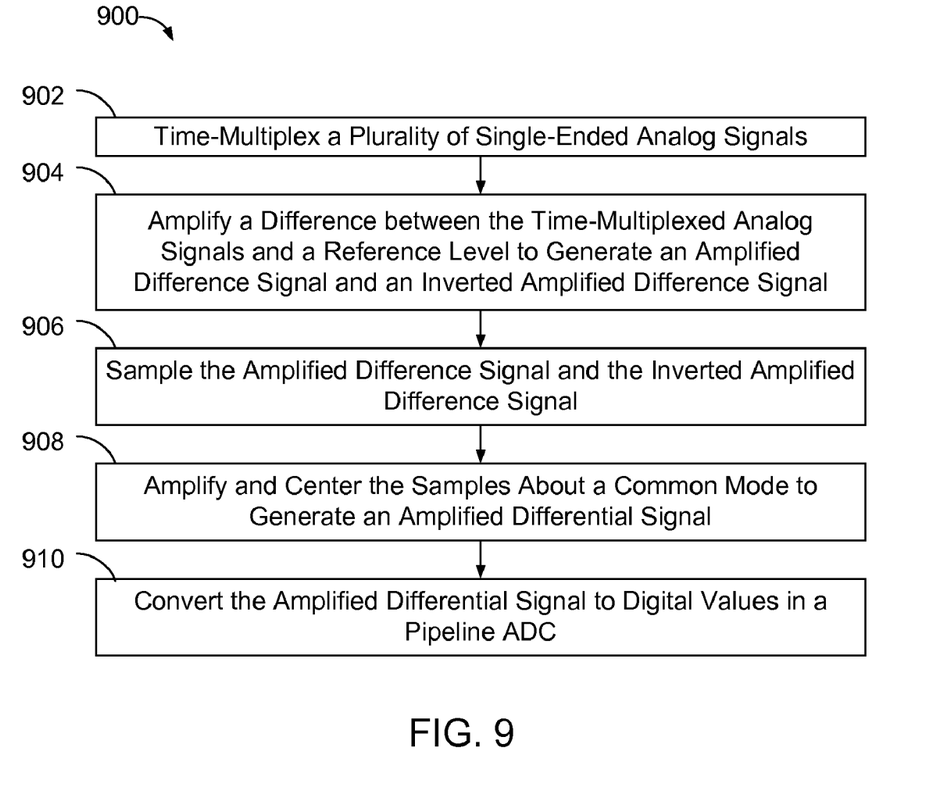
FIG. 9 is a process flowchart of an exemplary method of time-multiplexing a plurality of single-ended analog signals, amplifying and converting the time-multiplexed analog signals to a differential signal, and converting the differential signal to digital values corresponding to amplitudes of the single-ended analog signals.

FIG. 9 is a process flowchart of an exemplary method of time-multiplexing a plurality of single-ended analog signals, amplifying and converting the time-multiplexed analog signals to a differential signal, and converting the differential signal to digital values corresponding to amplitudes of the single-ended analog signals.

At 902, a plurality of single-ended analog signals is time-multiplexed onto a common signal path.

At 904, a difference between the time-multiplexed analog signals and a reference level are amplified to generate an amplified difference signal and a corresponding inverted amplified difference signal. The reference signal may be programmably generated to provide a soft start reference level, which may correspond to a band gap.

At 906, the amplified difference signal and the inverted amplified difference signal are sampled.

At 908, the samples are amplified and adjusted about a common mode to generate an amplified differential signal corresponding to the samples.

At 910, the amplified differential signal is converted to digital values in a differential pipeline analog-to-digital converter.

A bandwidth corresponding to the amplifying may be adjusted such as by adjusting a bias current. Where the bandwidth is adjusted, clock rates associated with the amplifying and the differential pipeline analog-to-digital converter may be adjusted in response to the adjusting of the bandwidth.

Method 900 may further include generating the plurality of direct current voltage levels from the one or corresponding reference voltages, adjusting one or more of the direct current voltage levels in response to the digital values, and synchronizing the adjusting of one or more of the direct current voltage levels and the time-multiplexing.

Method 900 may be implemented with respect to one or more examples herein, such as illustrated in one or more of FIGS. 1 through 8. Method 900 is not, however, limited to the examples of FIGS. 1 through 8.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A system, comprising:
   a multiplexer to receive a plurality of analog signals;
   a controller to control the multiplexer to time-multiplex the plurality of analog signals;
   a difference amplifier to amplify a voltage difference between the time-multiplexed analog signals and a reference level and to output a corresponding amplified difference signal and an inverted amplified difference signal; and
a switched capacitor circuit to sample the difference signal and the inverted difference signal, to amplify and center corresponding samples about a common mode, and to output the amplified centered samples as a differential signal.

2. The system of claim 1, wherein the switched capacitor circuit includes:
a switched capacitor sample circuit including first and second sample capacitors to receive corresponding samples from the amplified difference signal and the inverted amplified difference signal; and
a bias adjustable differential amplifier to amplify and adjust the samples from the first and second sample capacitors about a common mode, the bias adjustable differential amplifier including an adjustable current source to control a bandwidth of the bias adjustable differential amplifier.

3. The system of claim 2, wherein the difference amplifier includes first and second operational amplifiers, the bias adjustable differential amplifier includes an operational transconductance amplifier, and the first and second operational amplifiers and the operational transconductance amplifier are configured as an instrumentation amplifier.

4. The system of claim 2, further including:
a differential input pipeline analog-to-digital converter coupled to differential outputs of the switched capacitor circuit to convert the differential signal to digital values corresponding to voltage levels of the time-multiplexed analog signals; and
a programmable clock controller to control clock rates of the switched capacitor circuit and the differential input pipeline analog-to-digital converter to correspond to the bandwidth of the bias adjustable differential amplifier.

5. The system of claim 2, wherein the switched capacitor sample circuit includes:
first and second pass transistors in series with corresponding ones of the first and second sample capacitors, configured to close during a first portion of sample clock phases and to open during a second portion of the sample clock phases.

6. The system of claim 1, further including a programmable digital-to-analog converter to generate the reference level as a soft-start reference voltage.

7. The system of claim 1, further including:
a differential input pipeline analog-to-digital converter coupled to differential outputs of the switched capacitor circuit to convert the differential signal to digital values corresponding to voltage levels of the time-multiplexed analog signals.

8. The system of claim 7, further including:
a DC to DC converter to generate the plurality of analog signals as a plurality of direct current voltage levels from one or more corresponding direct current reference voltages; and
a digital control circuit to receive the digital values from the differential input pipeline analog-to-digital converter and to adjust one or more outputs to the DC to DC converter in response to the digital values;
wherein the controller is configured to synchronize the digital control circuit and the multiplexer with one another.

9. The system of claim 7, wherein the differential input pipeline analog-to-digital converter is configured to output the digital values corresponding to windowed portions of the time-multiplexed analog signals.

10. A system, comprising:
a difference amplifier to amplify a voltage difference between an analog signal and a reference level and to output a corresponding difference signal and an inverted difference signal;
a bias adjustable switched capacitor sample and amplify circuit to sample the difference signal and the inverted difference signal, to amplify and center corresponding samples about a common mode, and to output the amplified centered samples as a differential signal, the switched capacitor sample and amplify circuit including a bias adjustable current source to control a bandwidth of the switched capacitor sample and amplify circuit; and
a differential input pipeline analog-to-digital converter to convert the differential signal to digital values corresponding to voltage levels of the time-multiplexed analog signals.

11. The system of claim 10, further including:
a programmable clock controller to control clock rates of the bias adjustable switched capacitor sample and amplify circuit and the differential pipeline analog-to-digital converter to correspond to the bandwidth.

12. The system of claim 10, wherein the difference amplifier includes first and second operational amplifiers, the bias adjustable switched capacitor sample and amplify circuit includes an operational transconductance amplifier, and the first and second operational amplifiers and the operational transconductance amplifier are configured as an instrumentation amplifier.

13. The system of claim 10, further including a programmable digital-to-analog converter to generate the reference level as a soft-start reference voltage.

14. The system of claim 10, further including:
a multiplexer to receive a plurality of analog signals;
a controller to control the multiplexer to time-multiplex the plurality of analog signals and to output the time-multiplexed analog signals to the difference amplifier.

15. A method, comprising:
time-multiplexing a plurality of analog signals;
amplifying a difference between the time-multiplexed analog signals and a reference level to generate an amplified difference signal and a corresponding inverted amplified difference signal;
sampling the amplified difference signal and the inverted amplified difference signal;
amplifying and adjusting samples of the amplified difference signal and the inverted amplified difference signal about a common mode to generate an amplified differential signal corresponding to the samples;
adjusting a bandwidth of the amplifying; and
converting the amplified differential signal to digital values.

16. The method of claim 15, further comprising:
adjusting clock rates associated with the amplifying and adjusting and with the differential input pipeline analog-to-digital converter to correspond to the bandwidth.

17. The method of claim 15, further comprising:
programmably generating the reference level as a soft start reference level.

18. The method of claim 15, wherein the converting the amplified differential signal to digital values includes:
converting the amplified differential signal to the digital values in a differential pipeline analog-to-digital converter.

19. The method of claim 18, further comprising:
generating a plurality of direct current signals from one or more corresponding direct current reference voltages, wherein the time-multiplexing includes time-multiplexing the plurality of direct current signals;
controlling the generating of each of the plurality of direct current signals in response to corresponding digital values; and
synchronizing the controlling and the time-multiplexing with one another.

20. The method of claim 18, wherein the converting of the amplified differential signal to digital values includes outputting digital values corresponding to windowed portions of the time-multiplexed analog signals.

* * * * *

UNITED STATES PATENT AND TRADEMARK OFFICE
CERTIFICATE OF CORRECTION

PATENT NO. : 7,852,252 B2
APPLICATION NO. : 12/347081
DATED : December 14, 2010
INVENTOR(S) : Fuding Ge et al.

It is certified that error appears in the above-identified patent and that said Letters Patent is hereby corrected as shown below:

On the Face Page, in field (56), under (U.S. Patent Documents), in column 2, line 2,
below "5,847,600 A  *  12/1998   Brooks et al. ............... 330/9"
insert -- 6,529,070 B1   03/2003   Nagaraj ................... 330/9 --.

Signed and Sealed this
Fourteenth Day of June, 2011

David J. Kappos
*Director of the United States Patent and Trademark Office*